United States Patent
Ma et al.

(10) Patent No.: US 11,049,998 B2
(45) Date of Patent: Jun. 29, 2021

(54) ELECTROLUMINESCENT DISPLAY PANEL AND DISPLAY DEVICE

(71) Applicant: WuHan TianMa Micro-Electronics Co., Ltd., Wuhan (CN)

(72) Inventors: Yangzhao Ma, Wuhan (CN); Yuejun Tang, Wuhan (CN); Ruiyuan Zhou, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 1 day.

(21) Appl. No.: 16/729,312

(22) Filed: Dec. 28, 2019

(65) Prior Publication Data

US 2020/0135973 A1 Apr. 30, 2020

(30) Foreign Application Priority Data

Sep. 29, 2019 (CN) .......................... 201910937192.1

(51) Int. Cl.
*H01L 33/24* (2010.01)
*H01L 31/14* (2006.01)
*H01L 25/075* (2006.01)
*H01L 33/62* (2010.01)

(52) U.S. Cl.
CPC .......... *H01L 33/24* (2013.01); *H01L 25/0753* (2013.01); *H01L 31/14* (2013.01); *H01L 33/62* (2013.01)

(58) Field of Classification Search
CPC ..... H01L 33/24; H01L 25/0753; H01L 33/62; H01L 25/167; H01L 27/3211; H01L 27/3218; H01L 27/3227; H01L 27/3246; H01L 27/3276
See application file for complete search history.

(56) References Cited

U.S. PATENT DOCUMENTS

| 8,492,766 B2 * | 7/2013 | Yamazaki | H01L 27/288 257/59 |
| 2009/0027371 A1 * | 1/2009 | Lin | H01L 31/145 345/207 |

(Continued)

FOREIGN PATENT DOCUMENTS

| CN | 107768407 A | 3/2018 |
| CN | 108269503 A | 7/2018 |

*Primary Examiner* — Victor A Mandala
(74) *Attorney, Agent, or Firm* — Kilpatrick Townsend & Stockton, LLP

(57) ABSTRACT

An electroluminescent display panel and a display device are provided. In the embodiments of the disclosure, a photosensitive device is arranged in the photosensitive device arranging region. The extending line of at least one line is arranged in the photosensitive device arranging region so that the orthographic projection of the extending line on the light-emitting surface of the electroluminescent display panel overlaps with the first pixels in the first and second specific pixel groups in the photosensitive device arranging area; the first and second specific pixel groups include respective first pixels located in first straight lines of the second pixels correspondingly connected to two adjacent signal lines, the first and second specific pixel groups are adjacent in the second direction, and the first straight lines extend in the first direction.

14 Claims, 11 Drawing Sheets

(56) References Cited

U.S. PATENT DOCUMENTS

| | | | |
|---|---|---|---|
| 2014/0145150 A1* | 5/2014 | de Jong | H01L 27/3276 257/40 |
| 2017/0201662 A1* | 7/2017 | Kim | H04N 5/2258 |
| 2018/0240405 A1* | 8/2018 | Li | G09G 3/3406 |
| 2020/0212138 A1* | 7/2020 | Lee | H01L 51/447 |
| 2020/0328260 A1* | 10/2020 | Tang | H01L 27/322 |

* cited by examiner

ELECTROLUMINESCENT DISPLAY PANEL AND DISPLAY DEVICE

CROSS-REFERENCES TO RELATED APPLICATIONS

This application claims priority to Chinese patent application No. 201910937192.1 filed on Sep. 29, 2019, which is incorporated herein by reference in its entirety.

FIELD

The disclosure relates to the field of display technologies, and particularly to an electroluminescent display panel and a display device.

BACKGROUND

The electroluminescent display is a kind of self-luminance device, which can be implemented without the backlight source. Due to no backlight source, such display can be made even lighter and thinner than the liquid crystal display, and thus can be applied to a variety of scenarios.

The display panel in the electroluminescent display generally has a display region and a bezel region surrounding the display region. A camera and other optical devices may be arranged in the bezel region. Due to the larger volume of the camera, the area of the bezel region occupied by the camera is larger, causing the greater limitation in implementing the high screen-to-body ratio and implementing the narrow bezel design.

Then, how to increase the screen-to-body ratio of the display panel and implement the narrow bezel design is a problem which urgently needs to be.

SUMMARY

The embodiments of the disclosure provide an electroluminescent display panel and a display device, to increase the screen-to-body ratio of the display panel and achieve the narrow bezel design.

One embodiment of the disclosure provides an electroluminescent display panel, which includes a display region including a photosensitive device arranging region and a first normal display region which are arranged in a first direction;

the display region includes a plurality of pixels, the plurality of pixels include first pixels located in the photosensitive device arranging region and second pixels located in the first normal display region, and a region between adjacent first pixels is a light-transmission region, and an arranging density of the first pixels is less than an arranging density of the second pixels;

the second pixels are arranged in an array, at least one first pixel is arranged in an extending direction of the first direction, in which the second pixels is located, in the photosensitive device arranging region; the electroluminescent display panel further includes a plurality of signal lines extending in the first direction and arranged in a second direction, and each signal line is electrically connected to the corresponding second pixels arranged in the first direction, and the first direction is perpendicular to the second direction;

at least one of two adjacent signal lines has an extending line, the extending line is located in the photosensitive device arranging region and overlaps with orthographic projections of the first pixels in a first a specific pixel group and a second specific pixel group on a light-emitting surface of the electroluminescent display panel respectively, and the first pixels in the first specific and the second specific pixel group are electrically connected to one extending line;

and the first specific pixel group and the second specific pixel group include respective first pixels located in first straight lines of the second pixels correspondingly connected to two adjacent signal lines, the first specific pixel group and the second specific pixel group are adjacent in the second direction, and the first straight lines extend in the first direction.

One embodiment of the disclosure provides a display device including: the above electroluminescent display panel according to the embodiment of the disclosure and a photosensitive device;

and the photosensitive device is correspondingly arranged in the photosensitive device arranging region.

DETAILED DESCRIPTION

The specific embodiments of an electroluminescent display panel and a display device according to the embodiments of the disclosure will be illustrated below in details with reference to the drawings. It is should be noted that the described embodiments are only a part of the embodiments of the disclosure, but not all the embodiments. Based upon the embodiments of the disclosure.

Figure 1:
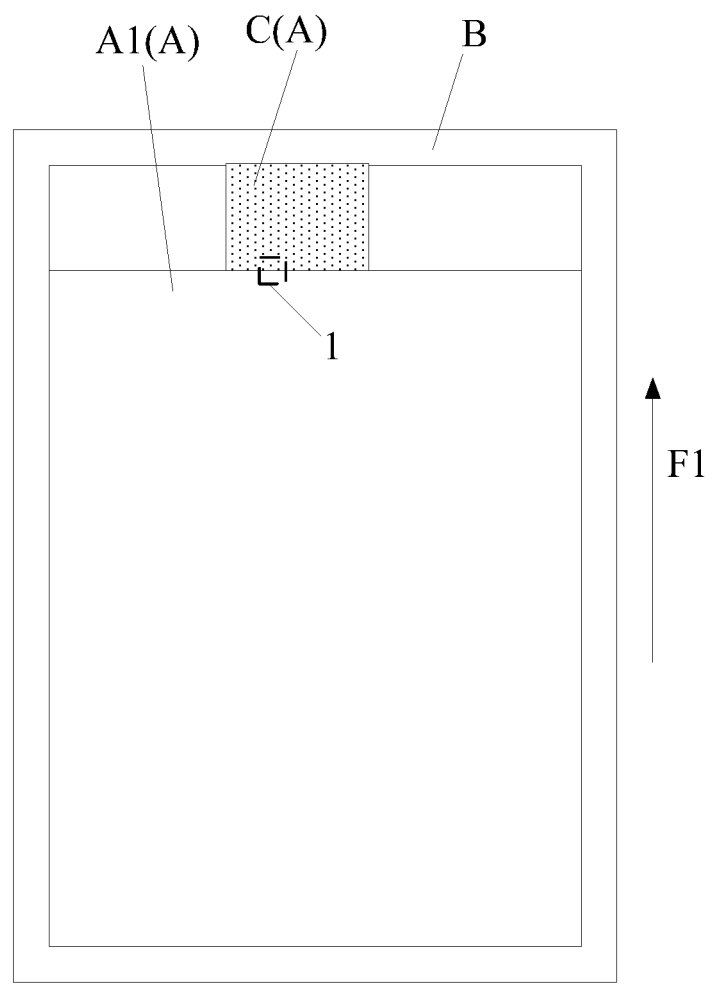
FIG. 1 is a schematic structural diagram of an electroluminescent display panel in accordance with an embodiment of the disclosure.
Figure 2:
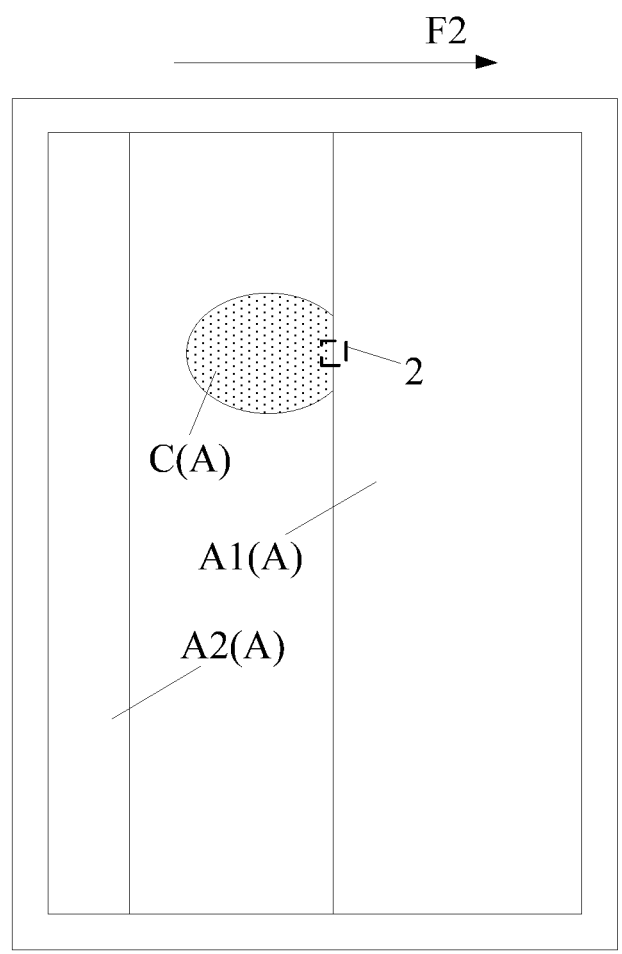
FIG. 2 is a schematic structural diagram of another electroluminescent display panel in accordance with an embodiment of the disclosure.
Figure 3:
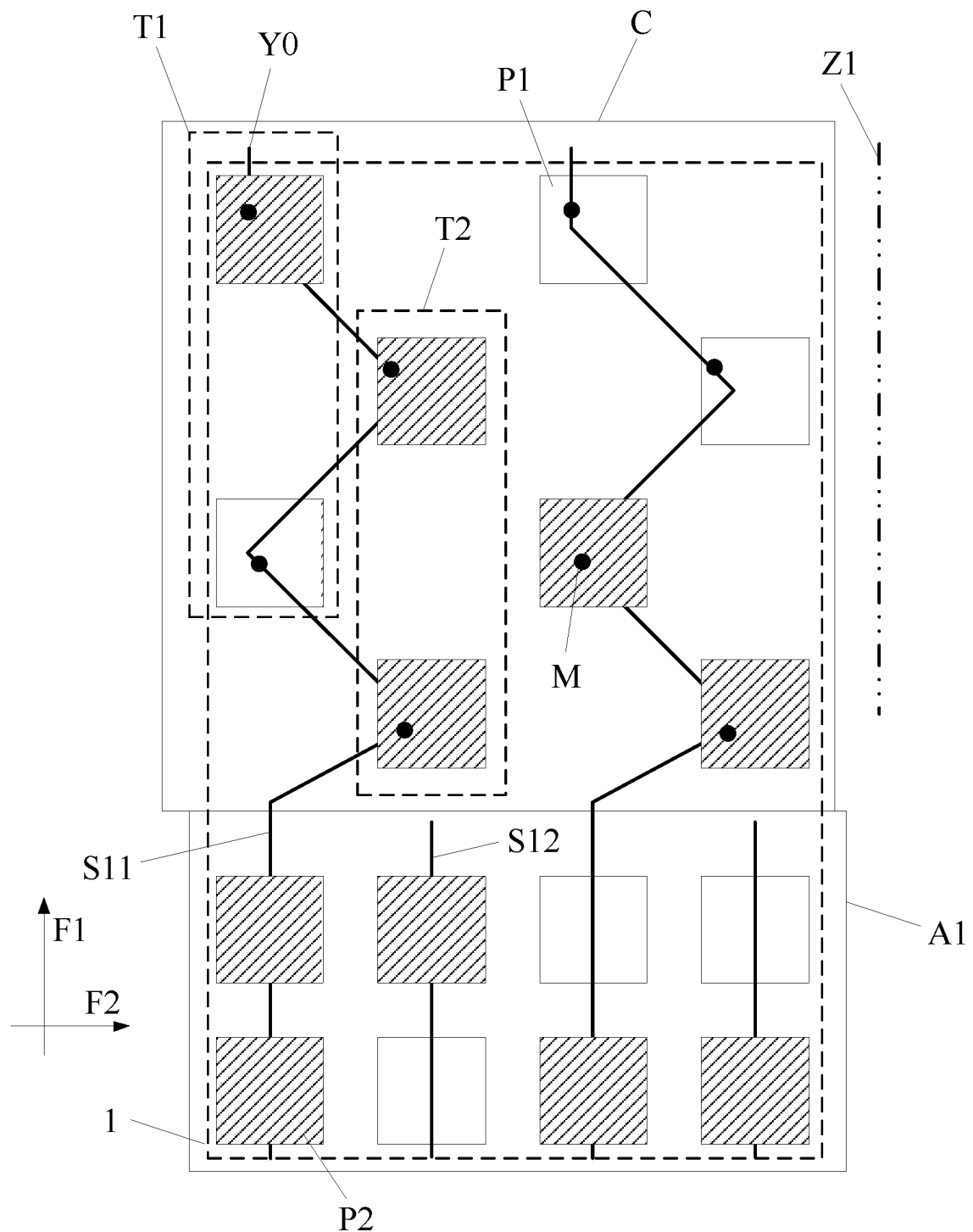
FIG. 3 is a partial enlarged view inside the dotted box 1 in FIG. 1.
Figure 4:
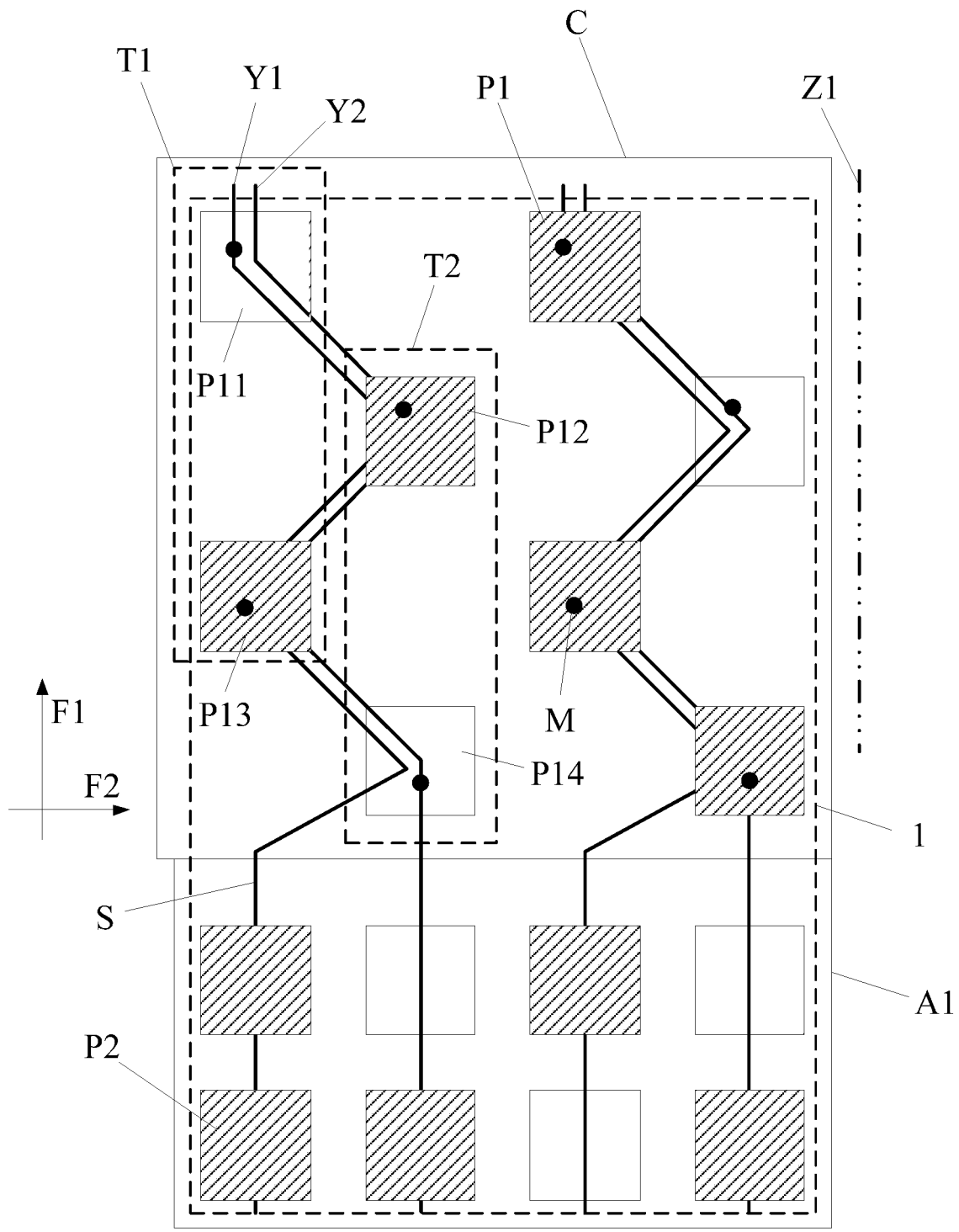
FIG. 4 is another partial enlarged view inside the dotted box 1 in FIG. 1.
Figure 5:
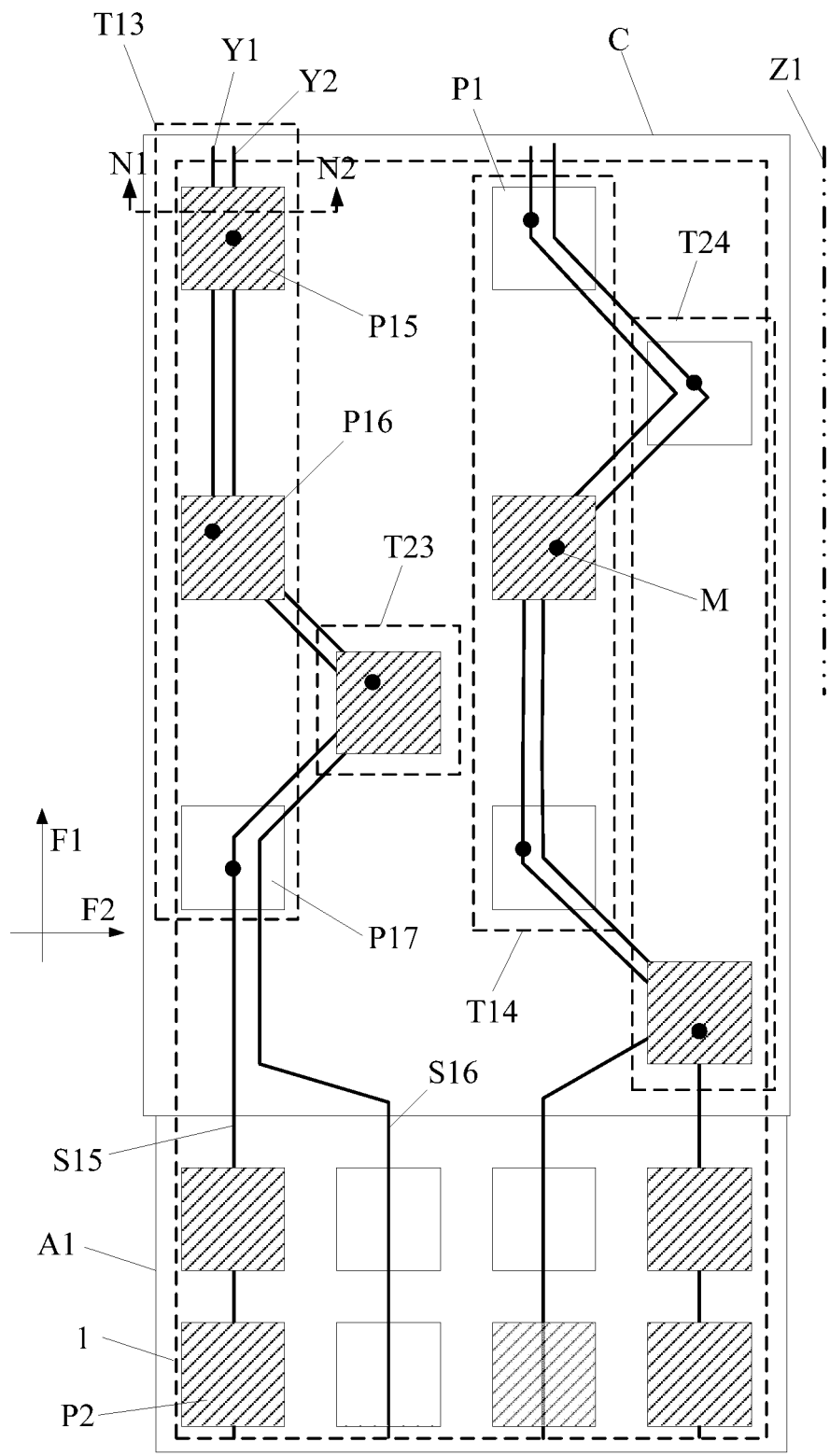
FIG. 5 is yet another partial enlarged view inside the dotted box 1 in FIG. 1.

An embodiment of the disclosure provides an electroluminescent display panel, as shown in FIGS. 1-5, FIG. 1 is a schematic structural diagram of an electroluminescent display panel, FIG. 2 is a schematic structural diagram of another electroluminescent display panel, FIG. 3 is a partial enlarged view inside the dotted box 1 in FIG. 1, FIG. 4 is another partial enlarged view inside the dotted box 1 in FIG. 1, and FIG. 5 is yet another partial enlarged view inside the dotted box 1 in FIG. 1.

As shown in FIGS. 1 and 2, the electroluminescent display panel can include a display region A including a photosensitive device arranging region C and a first normal display region A1, the first normal display region A1 and the photosensitive device arranging region C are arranged in the first direction;

the first direction may be the column direction, e.g., the F1 direction as shown in FIG. 1; or the first direction may be the row direction, e.g., the F2 direction as shown in FIG. 2. The following is illustrated in the case that the first direction is the column direction for example.

As shown in FIGS. 3-5, the display region includes a plurality of pixels including the first pixels P1 located in the photosensitive device arranging region C and the second pixels P2 located in the first normal display region A1, where the region between the adjacent first pixels P1 is a light-transmission region (not shown) and the arranging density of the first pixels P1 is less than the arranging density of the second pixels P2.

As shown in FIGS. 3-5, there are at least one first pixel P1 and a plurality of second pixels P2 arranged in the first direction (e.g., F1 direction).

The electroluminescent display panel further includes a plurality of signal lines (e.g., S in FIG. 4, S11 and S12 in FIG. 3, S15 and S16 in FIG. 5) extending in the first direction and arranged in the second direction, where each signal line is electrically connected to the corresponding second pixels P2 arranged in the first direction (e.g., F1 direction), and the first direction is perpendicular to the second direction (e.g., F2 direction).

At least one of two adjacent signal lines has an extending line (e.g., Y0 in FIG. 3, Y1 and Y2 in FIGS. 4 and 5), and the extending line is located in the photosensitive device arranging region C and overlaps with the orthographic projections of the first pixels P1 in the first specific pixel group (e.g., T1 in FIGS. 3 and 4, T13 and T14 in FIG. 5) and the second specific pixel group (e.g., T2 in FIGS. 3 and 4, T23 and T24 in FIG. 5) on the light-emitting surface of the electroluminescent display panel respectively, and the first pixels P1 in the first and second specific pixel groups are electrically connected to one extending line.

The first and second specific pixel groups include respective first pixels P1 on the first straight lines where the second pixels P2 correspondingly connected to two adjacent signal lines are located, the first and second specific pixel groups are adjacent in the second direction, and the first straight line (e.g., the dot line Z1 in FIGS. 3-5) extends in the first direction.

Of course, when the first direction is the row direction, the second direction is the column direction, and in this way, for the electroluminescent display panel, the specific case is as follows.

Referring to the partial enlarged view inside the dotted box 2 in FIG. 2, a plurality of signal lines included in the electroluminescent display panel extend in the first direction and are arranged in the second direction (e.g., S in FIG. 6), each signal line is electrically connected to the corresponding second pixels P2 arranged in the first direction (e.g., F2 direction), and the first direction is perpendicular to the second direction (e.g., F1 direction).

At least one of two adjacent signal lines has an extending line (e.g., Y1 and Y2 in FIG. 6) which is located in the photosensitive device arranging region C and overlaps with the orthographic projections of the first pixels P1 in the first specific pixel group (e.g., T1 in FIG. 6) and the second specific pixel group (e.g., T2 in FIG. 6) on the light-emitting surface of the electroluminescent display panel respectively, and the first pixels P1 in the first and second specific pixel groups are electrically connected to one extending line.

The first and second specific pixel groups include respective first pixels P1 on the first straight lines where the second pixels P2 correspondingly connected to two adjacent signal lines are located, the first and second specific pixel groups are adjacent in the second direction, and the first straight line (e.g., the dot line Z2 in FIG. 6) extends in the first direction.

In the embodiments of the disclosure, the display region A includes the photosensitive device arranging region C, and when the photosensitive device is arranged in the photosensitive device arranging region C, the problem that the occupied area is relatively large when the photosensitive device is arranged at the bezel (e.g., the non-display region B in FIG. 1) can be avoided, so that the bezel can be made narrower, increasing the screen-to-body ratio and implementing the narrow bezel design.

Secondly, the extending lines are arranged, that is, the extending lines overlap with the orthographic projections of the first pixels P1 in the first and second specific pixel groups on the light-emitting surface of the electroluminescent display panel respectively, and the first pixels P1 in the first and second specific pixel groups are electrically connected to one extending line, so that the shapes of the orthographic projections of the extending lines on the light-emitting surface of the electroluminescent display panel are arranged along the arrangement of the first pixels P1 in the first and second specific pixel groups, reducing the shielding of the extending lines for the light-transmitting region, increasing the area of the light-transmitting region, improving the light transmittance of the photosensitive device arranging region C, thus improving the performance of the photosensitive device and improving the reliability of the display device.

In one embodiment of the disclosure, the shape of the photosensitive device arranging region can be a rectangle, as shown in FIG. 1, or may be an oval, as shown in FIG. 2. Of course, it may also be another shape and may be set according to the actual demand, which is not limited here.

In one embodiment of the disclosure, the signal lines and the extending lines are all made from the metal materials so that the signal lines have the lower resistance and better electrical conductivity and the signals can be transmitted effectively via the signal lines to ensure that the electroluminescent display panel has the better display effect.

The metal for fabricating the signal lines and the extending lines may be molybdenum or another metal, and may be selected according to the actual situation, which is not limited here.

In one embodiment, there are several ways of arranging the extending lines as follows.

One way of arranging the extending lines is as follows.

In one embodiment of the disclosure, only one of two adjacent signal lines has the extending line.

In this way, the first pixels in the first and second specific pixel groups are electrically connected to the extending line.

In one embodiment, as shown in FIG. 3, the first direction is the column direction and represented by F1, two adjacent signal lines are marked as S11 and S12 respectively, only the signal line S11 has the extending line (marked as Y0) and the signal line S12 has no extending line. The first specific pixel group is represented by T1 and the second specific pixel group is represented by T2, then:

two first pixels in the first specific pixel group T1 and two first pixels in the second specific pixel group T2 are all electrically connected to the extending line Y0 (the solid dot M represents the electrical connection of the first pixel and the extending line in FIG. 3). When the orthographic projection of the extending line Y0 on the light-emitting surface of the electroluminescent display panel is the third projection, the orthographic projections of two first pixels in the first specific pixel group T1 on the light-emitting surface of the electroluminescent display panel are the fourth projections, and the orthographic projections of two first pixels in the second specific pixel group T2 on the light-emitting surface of the electroluminescent display panel are the fifth projections, the third projection overlaps with the fourth and fifth projections respectively.

Thus, on the one hand, the number of the extending lines arranged in the photosensitive device arranging region C may be decreased, and then the shielding of the extending lines for the light in the photosensitive device arranging region C can be decreased when the extending lines are made of opaque material (such as metal), to thereby increase the light transmittance of the photosensitive device arranging region C, so that the photosensitive device may receive more light from the outside of the electroluminescent display panel, to improve the working performance of the photosensitive device and ultimately improve the performance of the display device.

On the other hand, since all the first pixels in the first and second specific pixel groups are electrically connected to the extending line, the less extending lines may be used to provide the signals to all the first pixels, to facilitate driving the first pixels to emit light, so that not only the photosensitive device arranging region C can realize the normal display in the display stage, but also the structure complexity in the photosensitive device arranging region C can be reduced and the manufacturing difficulty of the electroluminescent display panel can be reduced, to reduce the manufacturing difficulty of the display device and improve the production yield of the product.

Specifically, in an embodiment of the disclosure, the electroluminescent display panel further includes a non-display region B surrounding the display region A.

The photosensitive device arranging region C is arranged at the side of the display region A close to the non-display region B.

In one embodiment, as shown in FIG. 1, the region filled with the sparse black spots represents the photosensitive device arranging region C which is located at the edge of the display region A and between the non-display region B and the first normal display region A1.

In this way, the number of the arranged extending lines may be decreased, and the light transmittance of the photosensitive device arranging region C may be increased, it may be further ensured that the electroluminescent display panel can display the image normally, thus improving the reliability of the display device.

Another way of arranging the extending lines is as follows.

Figure 6:
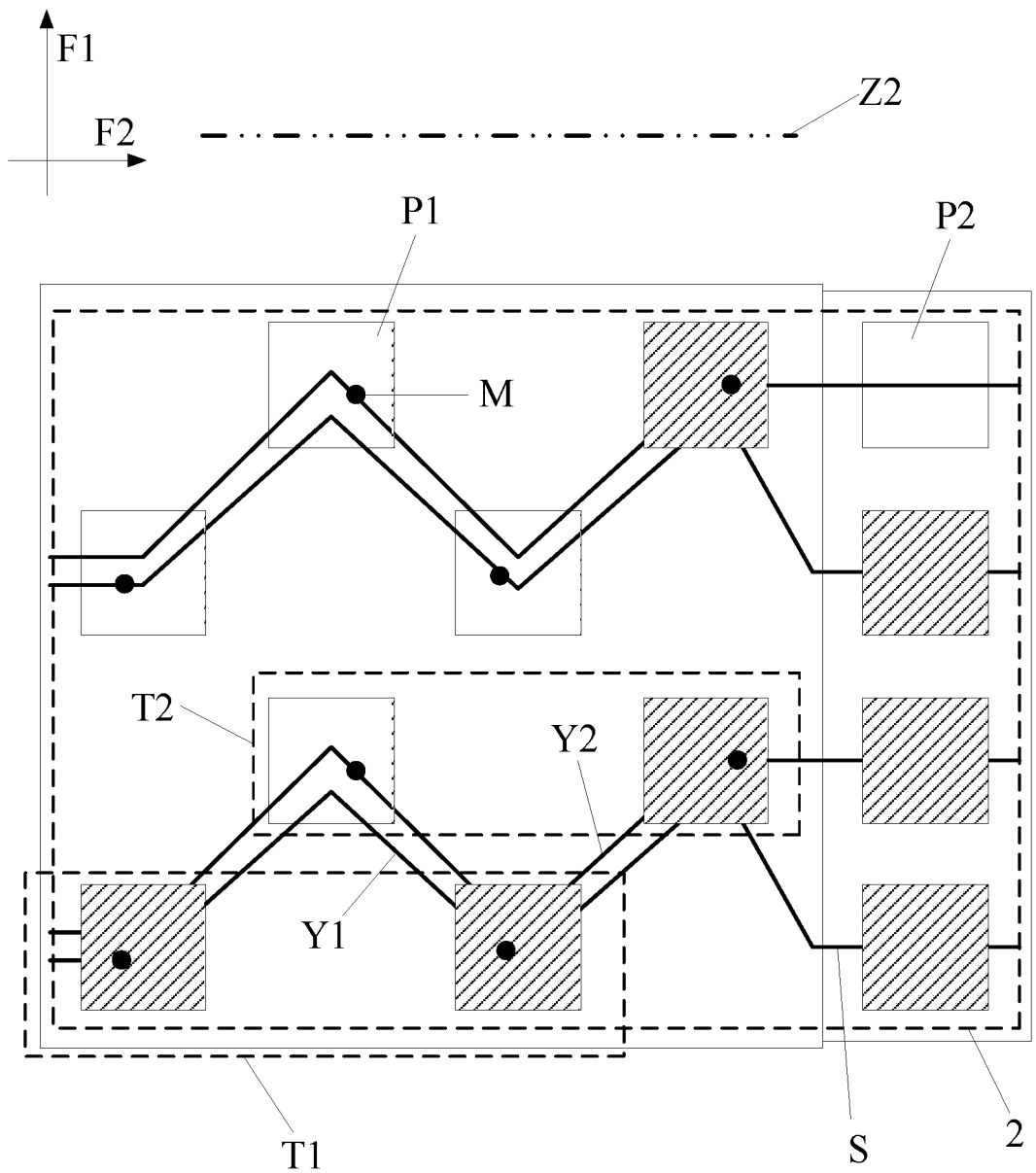
FIG. 6 is a partial enlarged view inside the dotted box 2 in FIG. 2.

In one embodiment of the disclosure, both of two adjacent signal lines have the extending lines including the first extending line and second extending line, that is, in two adjacent signal lines, the extending line of one signal line is the first extending line, and the extending line of the other signal line is the second extending line, as shown in FIGS. 4-6.

In this way, when the position of the photosensitive device arranging region C is set, in an embodiment of the disclosure, the photosensitive device arranging region C may be arranged at the edge of the display region A, as shown in FIG. 1, thus it is beneficial to balance the load of two signal lines, reduce the voltage difference between two signal lines, and improve the display uniformity.

Of course, the photosensitive device arranging region C may also be arranged at the middle position of display region A, that is, the display region A further includes a second normal display region A2, and the photosensitive device arranging region C is located between the first normal display region A1 and the second normal display region A2, as shown in FIG. 2.

Therefore, in one embodiment, when the extending lines are arranged in the second way, the position of the photosensitive device arranging region C may be set according to the actual demand, and is not limited here as long as the light transmittance of the photosensitive device arranging region C can be increased.

In one embodiment of the disclosure, the first pixels in the first specific pixel group and the first pixels in the second specific pixel group are misaligned in the first direction.

Taking the structure shown in FIG. 4 as an example, the first direction is the column direction, i.e., the direction represented by F1, the first specific pixel group is represented by T1 and includes two first pixels represented by P11 and P13 respectively; and the second specific pixel group is represented by T2 and also includes two first pixels represented by P12 and P14 respectively.

The first pixel P11 is located in different row and column from the first pixels P12 and P14 respectively, and similarly, the first pixel P13 is located in different row and column from the first pixels P12 and P14 respectively. The first pixel P12 is located in the pixel row between the first pixels P11 and P13, and the first pixel P13 is located in the pixel row between the first pixels P12 and P14, so that the first pixels P11 and P13 are misaligned with the first pixels P12 and P14 respectively.

Since the arranging density of the first pixels in the photosensitive device arranging region C is smaller, the more uniform image can be displayed in the photosensitive device arranging region C in the display stage due to such arrangement, to facilitate improving the display uniformity and thus improving the display effect.

Specifically, in the actual situation, the numbers of the first pixels included in the first and second specific pixel groups are set as the following cases.

In one embodiment of the disclosure, the numbers of the first pixels included in the first and second specific pixel groups are same.

In one embodiment, as shown in FIG. 4, the first direction is the column direction, i.e., the direction shown by F1, the first specific pixel group T1 includes two first pixels, and the second specific pixel group T2 also includes two first pixels.

In another example, as shown in FIG. 6, the first direction is the row direction, i.e., the direction shown by F2, the first specific pixel group T1 includes two first pixels, and the second specific pixel group T2 also includes two first pixels.

Such arrangement can facilitate optimizing the structure in the photosensitive device arranging region C and thus facilitate fabricating the electroluminescent display panel.

In this way, when the first and second extending lines are arranged, in an embodiment of the disclosure, they may be arranged as follows:

the first extending line is electrically connected to all the first pixels in the first specific pixel group, and overlaps with all the first pixels in the second specific pixel group;

the second extending line is electrically connected to all the first pixels in the second specific pixel group, and overlaps with all the first pixels in the first specific pixel group.

In one embodiment, still referring to FIG. 4, for two first pixels (i.e., first pixels P11 and P13) in the first specific pixel group T1 and two first pixels (i.e., first pixels P12 and P14) in the second specific pixel group T2, the first extending line Y1 is electrically connected to the first pixels P11 and P13 and further overlaps with the orthographic projections of the first pixels P12 and P14 on the light-emitting surface of the electroluminescent display panel; the second extending line Y2 is electrically connected to the first pixels P12 and P14 and further overlaps with the orthographic projections of the first pixels P11 and P13 on the light-emitting surface of the electroluminescent display panel.

That is, both the first and second extending lines overlap with the orthographic projections of the first pixels in the first specific pixel group on the light-emitting surface of the electroluminescent display panel, and further overlap with the orthographic projections of the first pixels in the second specific pixel group on the light-emitting surface of the electroluminescent display panel, but the first extending line is electrically connected to only the first pixels in the first specific pixel group and the second extending line is electrically connected to only the first pixels in the second specific pixel group.

Thus the numbers of the first pixels electrically connected to the first and second extending lines respectively are same, and for the orthographic projections on the light-emitting surface of the electroluminescent display panel, the number of the first pixels overlapping with the first extending line is the same as the number of the first pixels overlapping with the second extending line, so that the coupling capacitances on the first and second extending lines are consistent, to balance the load of the first and second extending lines, improve the consistency of the signals transmitted on the first and second extending lines, thus improving the display uniformity of the electroluminescent display panel.

In one embodiment of the disclosure, the number of the first pixels in the first specific pixel group is greater than the number of the first pixels in the second specific pixel group.

In one embodiment, as shown in FIG. 5, the first specific pixel group marked as T13 includes three first pixels, and the second specific pixel group marked as T23 includes one first pixel; or the first specific pixel group marked as T14 includes three first pixels, and the second specific pixel group marked as T24 includes two first pixels.

That is, the numbers of the first pixels included in the first and second specific pixel groups are not limited specifically. The numbers of the first pixels included in all the first specific pixel groups are same and the numbers of the first pixels included in all the second specific pixel groups are same, which is not shown in the figure; or the numbers of the first pixels included in all the first specific pixel groups are same and the numbers of the first pixels included in all the second specific pixel groups are different, as shown in FIG. 5; or the numbers of the first pixels included in all the first specific pixel groups are different and the numbers of the first pixels included in all the second specific pixel groups are same, which is not shown in the figure. In the actual situation, the numbers may be defined according to the actual demand, to meet the requirements of various application scenarios and increase the design flexibility.

Specifically, in an embodiment of the disclosure, both of two adjacent signal lines have the extending lines including the first and second extending lines, and:

the first extending line is electrically connected to a part of the first pixels in the first specific pixel group, the second extending line is electrically connected to all the first pixels in the second specific pixel group and the other first pixels in the first specific pixel group, the number of the first pixels electrically connected to the first extending line is N1, and the number of the first pixels electrically connected to the second extending line is N2, and $0 \leq |N1-N2| \leq 1$.

Please note that the case when both of two adjacent signal lines have the extending lines including the first and second extending lines may be understood as: in two adjacent signal lines, the extending line of one signal line is the first extending line, and the extending line of the other signal line is the second extending line.

In one embodiment, as shown in FIG. 5, two adjacent signal lines are marked as S15 and S16 respectively. When the extending line of the signal line S15 is the first extending line (represented by Y1) and the extending line of the signal line S16 is the second extending line (represented by Y2), the first extending line Y1 is only electrically connected to the first pixels P16 and P17 in the first specific pixel group T13, and the second extending line Y2 is not only electrically connected to one first pixel in the second specific pixel group T23 but also electrically connected to the first pixel P15 in the first specific pixel group T13.

In such arrangement, for the orthographic projections on the light-emitting surface of the electroluminescent display panel, the number of the first pixels overlapping with the first extending line is approximately the same as the number of the first pixels overlapping with the second extending line, so that the coupling capacitances on the first extending line and second extending lines are consistent, and on this basis, it is beneficial to reduce the difference in the numbers of the first pixels electrically connected to the first and second extending lines respectively, and then balance the load of the first and second extending lines and improve the consistency of the signals transmitted on the first and second extending lines, thus improving the display uniformity of the electroluminescent display panel.

Please be noted that in FIG. 5, since the first specific pixel group T14 includes three first pixels and the second specific pixel group T24 includes two first pixels, when using such arrangement in which "the first extending line is electrically connected to a part of the first pixels in the first specific pixel group, the second extending line is electrically connected to all the first pixels in the second specific pixel group and the other first pixels in the first specific pixel group" can reduce the difference in the numbers of the first pixels electrically connected to the first and second extending lines as much as possible to balance the load of the first and second extending lines, but how to arrange specifically may be based on the actual situation and is not limited here.

Specifically, in an embodiment of the disclosure, when the sum of the number of the first pixels included in the first specific pixel group and the number of the first pixels included in the second specific pixel group is an odd number, $|N1-N2|$ may be set as 1; or when the sum of the number of the first pixels included in the first specific pixel group and the number of the first pixels included in the second specific pixel group is an even number, $|N1-N2|$ may be set as 0.

In one embodiment, as shown in FIG. 5, the number of the first pixels electrically connected to the first extending line marked as Y1 is 2, and the number of the first pixels electrically connected to the second extending line marked as Y2 is also 2.

Thus the difference between the number of the first pixels electrically connected to the first extending line and the number of the first pixels electrically connected to the second extending line can be reduced as much as possible, thus balancing the loads of the first and second extending lines, improving the consistency of the signals transmitted on the first and second extending lines, improving the display uniformity of the electroluminescent display panel.

Therefore, through the arrangements of the first and second cases, no matter how to set the first and second specific pixel groups as long as the loads of the first and second extending lines can be balanced and the consistency of the signals transmitted on the first and second extending lines can be improved. The selection of arrangement can be based on the actual situation to meet the requirements of various application scenarios and improve the design flexibility.

Please be noted that the structures shown in FIGS. 4 and 5 are illustrated when the first direction is the column direction as an example. In the actual situation, the first direction may also be the row direction, as shown in FIG. 6, and when the structure shown in FIG. 6 is compared with FIG. 4, only the directions are different and the structures are substantially similar, and the detailed description thereof will be omitted here.

Figure 7:
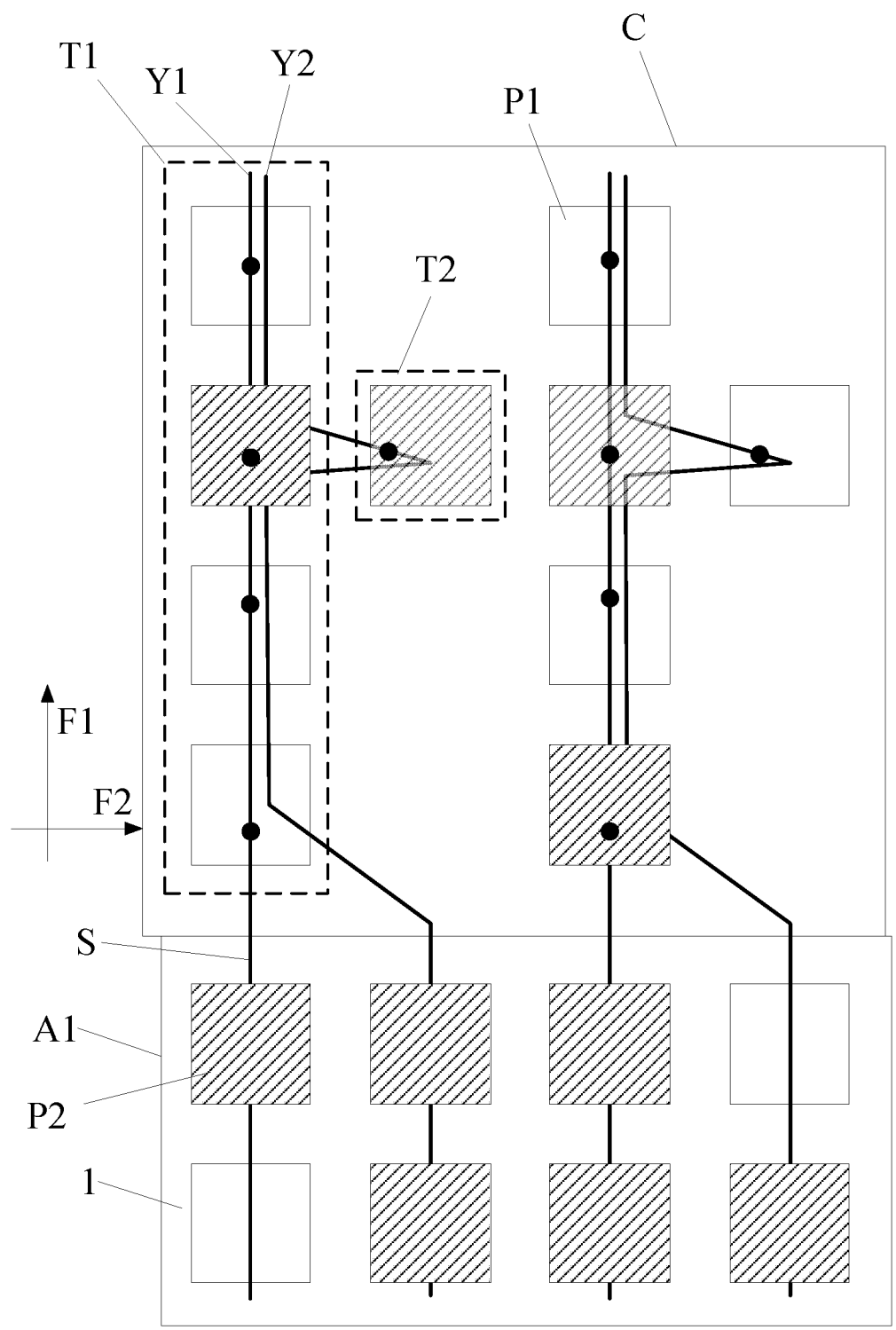
FIG. 7 is yet another partial enlarged view inside the dotted box 1 in FIG. 1.
Figure 8:
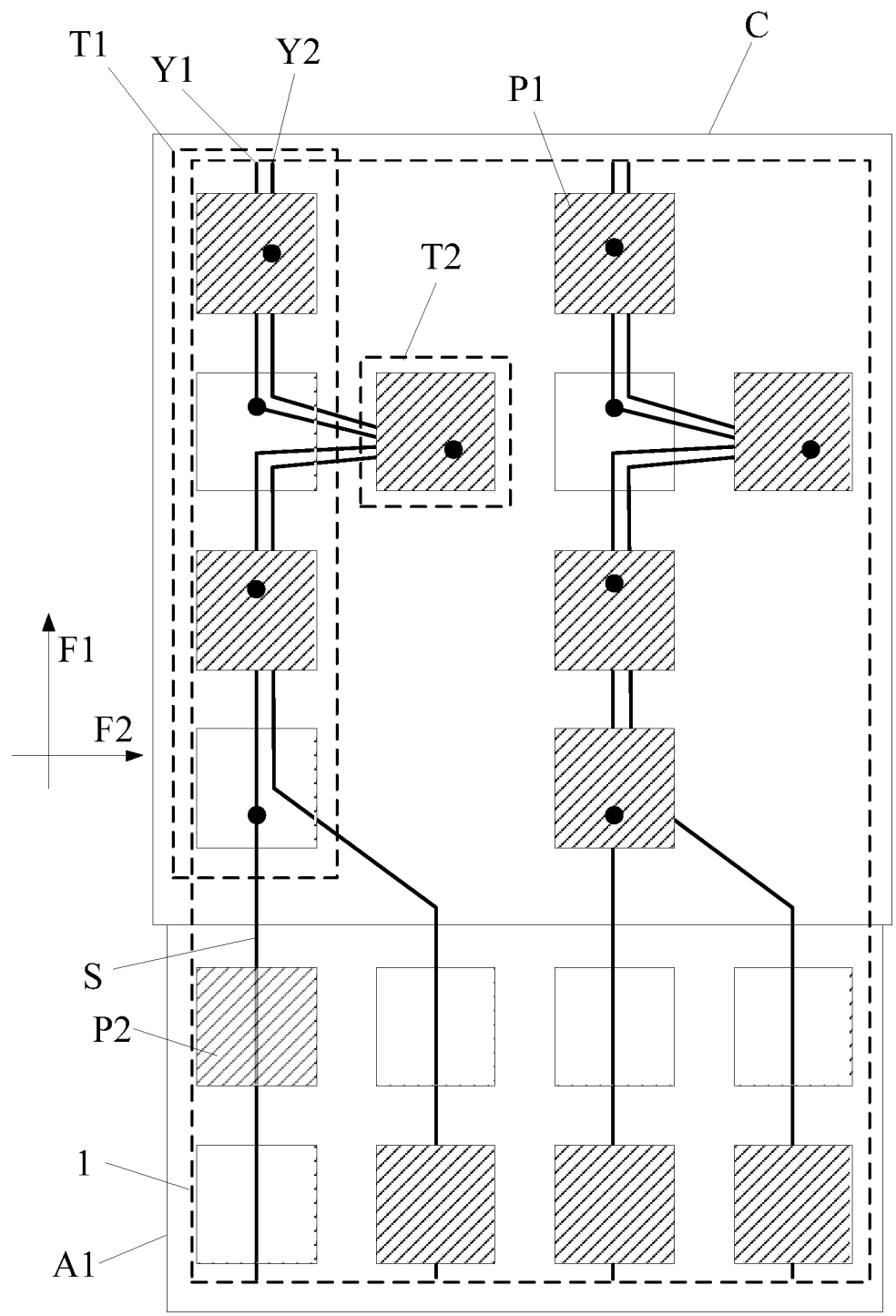
FIG. 8 is yet another partial enlarged view inside the dotted box 1 in FIG. 1.

In the actual situation, the arrangement case of the first pixels in the photosensitive device arranging region C is only illustrated when the first direction is the column direction as an example. As shown in FIGS. 7 and 8, at least one first pixel in the first specific pixel group T1 is arranged in the same layer as one first pixel in the second specific pixel group T2.

In this way, when both of two adjacent signal lines have the extending lines which are the first and second extending lines respectively, the following arrangement is also possible.

In one embodiment, as shown in FIG. 7, although the number of the first pixels included in the first specific pixel group T1 is greater than the number of the first pixels included in the second specific pixel group T2, the first extending line Y1 is electrically connected to all the first pixels in the first specific pixel group T1, the second extending line Y2 is only electrically connected to the first pixel in the second specific pixel group T2, the first extending line Y1 only overlaps with the orthographic projection of the first specific pixel group T1 on the light-emitting surface of the electroluminescent display panel and does not overlap with the orthographic projection of the second specific pixel group T2 on the light-emitting surface of the electroluminescent display panel, and the second extending line Y2 overlaps with the orthographic projections of the first specific pixel group T1 and the second specific pixel group T2 on the light-emitting surface of the electroluminescent display panel respectively.

Thus, the structure complexity of the photosensitive device arranging region C to facilitate the production of the electroluminescent display panel, reducing the production difficulty of the electroluminescent display panel and improving the production yield of the product.

The difference of this embodiment from the above-mentioned embodiment is: both the first and second extending lines overlap with the orthographic projections of the first and second specific pixel groups on the light-emitting surface of the electroluminescent display panel, which is not shown in figure.

Thus, it may be beneficial to reduce the length difference between the first and second extending lines and balance the loads of the first and second extending lines, improving the display uniformity of the electroluminescent display panel.

In one embodiment, as shown in FIG. 8, the difference of this embodiment from the above-mentioned embodiment is: both the first extending line Y1 and the second extending line Y2 overlap with the orthographic projections of the first specific pixel group T1 and the second specific pixel group T2 on the light-emitting surface of the electroluminescent display panel, the first extending line Y1 is electrically connected to a part of the first pixels in the first specific pixel group T1, and the second extending line Y2 is not only electrically connected to the first pixels in the second specific pixel group T2 but also electrically connected to the other first pixels in the first specific pixel group T1.

Thus, for the orthographic projections on the light-emitting surface of the electroluminescent display panel, the number of the first pixels overlapping with the first extending line is approximately the same as the number of the first pixels overlapping with the second extending line, so that the coupling capacitances on the first and second extending lines are consistent, and it is beneficial to reduce the difference between the number of the first pixels electrically connected to the first extending line and the number of the first pixels electrically connected to the second extending line and reduce the length difference between the first and second extending lines, thus further balancing the loads of the first and second extending lines and further improving the display uniformity of the electroluminescent display panel.

In this embodiment, when the first and second extending lines are arranged, any of the above-mentioned embodiments may be used, which may be selected according to the actual demand, to meet the requirements of various application scenarios and increase the design flexibility.

It is should be noted that when both of two adjacent signal lines have the extending lines, both the first and second extending lines overlap with the orthographic projections of a plurality of first pixels on the light-emitting surface of the electroluminescent display panel. Thus, in order to avoid the interference and short circuit between the first and second extending lines, in an embodiment of the disclosure, the first and second extending lines are arranged in different layers, and the orthographic projection of the first extending line on the light-emitting surface of the electroluminescent display panel overlaps with the orthographic projection of second extending line on the light-emitting surface of the electroluminescent display panel.

Figure 9:
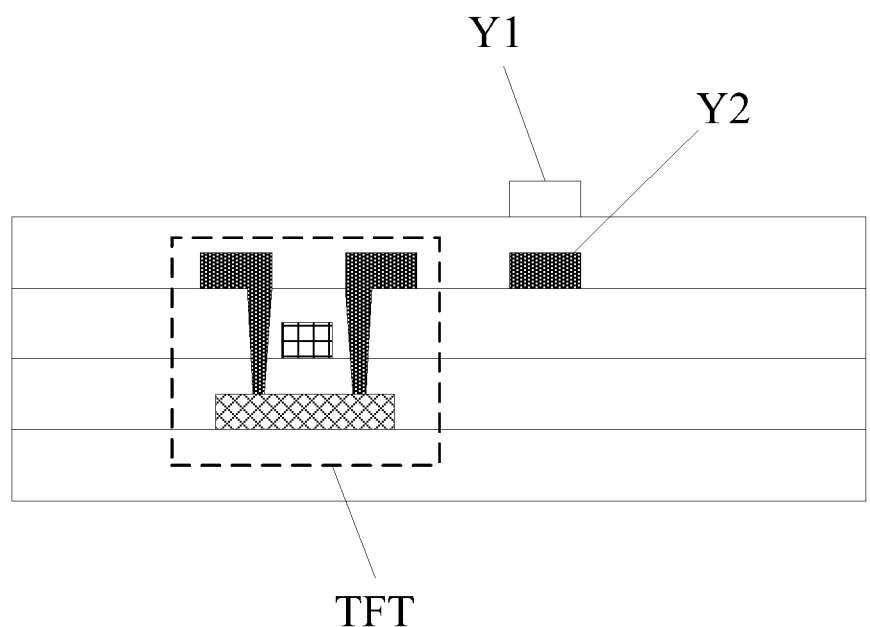
FIG. 9 is a section view along the N1-N2 direction in FIG. 5.

In one embodiment, as shown in FIG. 9 that is a section view along the N1-N2 direction in FIG. 5, the transistor TFT in this figure is one of the transistors included in the first pixel P11, the second extending line Y2 and the source/drain (e.g., the region filled with the dense black spots) of the transistor TFT are of the same material and arranged in the same layer, and the first extending line Y1 is located at the side of the source/drain of the transistor TFT away from the gate (e.g., the region filled with the crossed grids). And the orthographic projections of the first extending line Y1 and the second extending line Y2 on the light-emitting surface of the electroluminescent display panel overlap.

FIG. 9 shows the top gate-type transistor. Of course, in the actual situation, the transistor may also be of bottom gate type, which is not limited here.

Such arrangement, on the one hand, may avoid the short circuit caused by the too small distance between the first and second extending lines and then avoid the mutual interference between the first and second extending lines, to ensure the transmission of the signals and improve the reliability of the electroluminescent display panel; on the other hand, may reduce the space in the row direction occupied by the first and second extending lines, to improve the light transmittance of the photosensitive device arranging region C and improve the performance of the display device.

In one embodiment, in order to further improve the light transmittance of the photosensitive device arranging region C, in an embodiment of the disclosure, the orthographic projections of the first pixels on the light-emitting surface of the electroluminescent display panel are the first projections, at least a part of the first projections includes the first and second segments connected, the first segment extends in the third direction, and the second segment extends in the fourth direction;

the orthographic projection of the extending line on the light-emitting surface of the electroluminescent display panel is the second projection, the second projection includes the second sub-projection overlapping with at least a part of the first projections, the second sub-projection includes the third and fourth segments connected, the third segment extends in the third direction, and the fourth segment extends in the fourth direction;

the third direction intersects with the fourth direction, and the third and fourth directions both intersect with the row and column directions.

Figure 10:
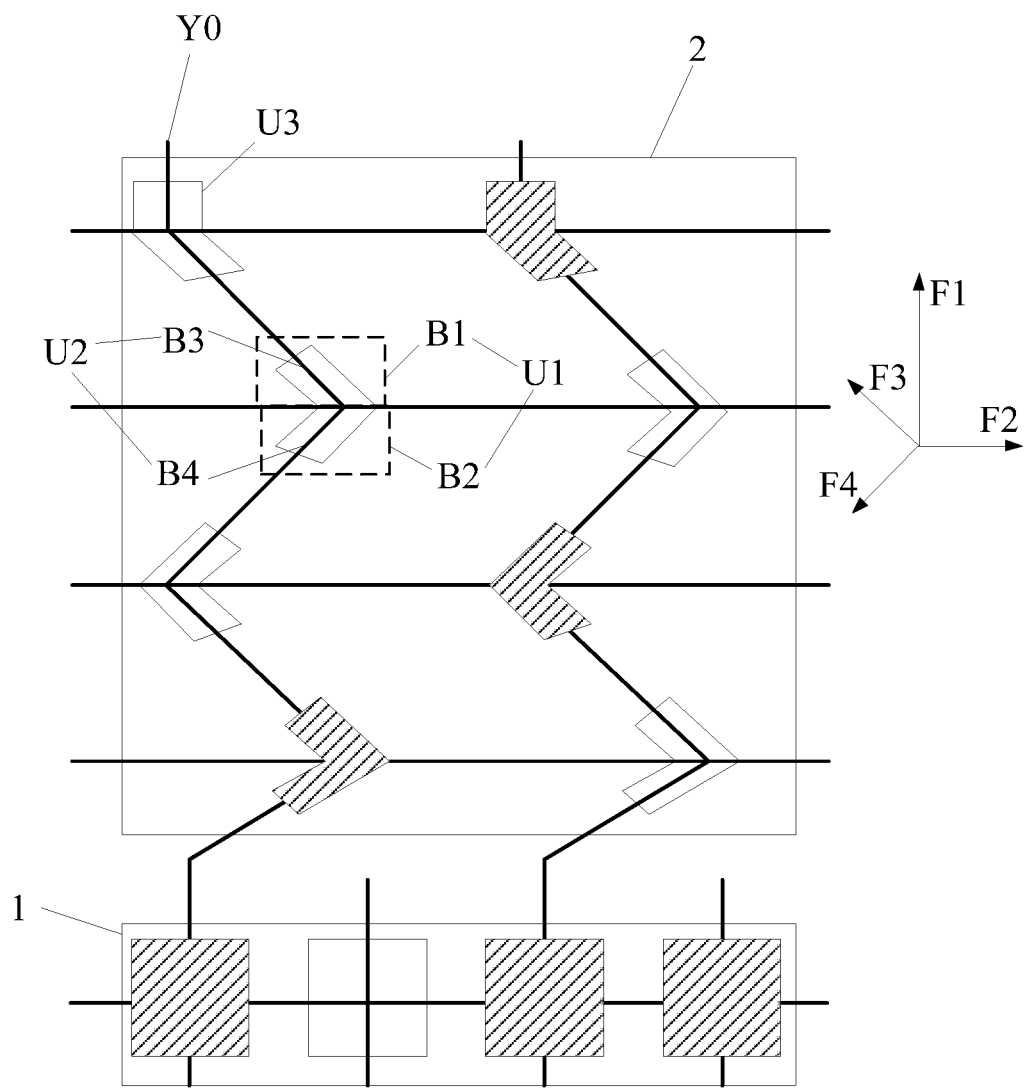
FIG. 10 is yet another partial enlarged view inside the dotted box 1 in FIG. 1.

Taking the structure shown in FIG. 10 as an example and taking the first projection marked as U1 corresponding to the first pixel as an example, the first projection includes the first segment B1 and the second segment B2, the third direction is represented by F3, the fourth direction is represented by F4, the column direction is represented by F1 and the row direction is represented by F2. Here, the first segment B1 extends in the third direction F3 and the second segment B2 extends in the fourth direction F4. Please note that F1, F2, F3 and F4 represent different directions in the same plane.

By taking the second sub-projection marked as U2 corresponding to the extending line Y0 as an example, the second sub-projection includes the third segment B3 and the fourth segment B4, and the third segment B3 extends in the third direction F3, and the fourth segment B4 extends in the fourth direction F4.

Therefore the first segment B1 and the third segment B3 are arranged in parallel, and the second segment B2 and the fourth segment B4 are arranged in parallel, so that two segments in the first projection U1 are parallel to two segments in the second sub-projection U2 respectively, that is, the first pixels are arranged and deployed along the line shape of the extending line.

Thus, the area of the light-transmission region in the photosensitive device arranging region C may be increased, then the light transmittance of the photosensitive device arranging region C is increased, more light is provided for the photographic experience, and the performance of the photosensitive device is improved, improving the performance of the display device.

In an embodiment, the above first projection of the first pixel on the light-emitting surface of the electroluminescent display panel may be understood as the opening region (i.e., the region for display image) of the first pixel. In order to arrange and deploy the first pixels along the line shape of the extending line, in an embodiment of the disclosure, how to set the shape of the opening region is correspondingly based on how to set the shape of the second sub-projection, e.g., the first projection marked as U3 in FIG. 10 as well as the first projection U1, to increase the area of the light-transmitting region as much as possible and increase the light transmittance of the photosensitive device arranging region C.

Moreover, there may be no need to make may adjustment for the shape of the orthographic projection of the second pixel P2 on the light-emitting surface of the electroluminescent display panel, to reduce the changes to the structure of the electroluminescent display panel and reduce the manufacture difficulty of the electroluminescent display panel.

In one embodiment of the disclosure, the first pixel includes a pixel circuit and a light-emitting unit connected electrically, and the light-emitting unit includes an anode.

In this way, the shape of the orthographic projection of the pixel circuit and the anode on the light-emitting surface of the electroluminescent display panel is same as the shape of the first projection.

Thus, when the shape of the first projection is set, it may be ensured that the first pixel has the larger aperture region (i.e., the light-emitting region in the pixel), to reduce the influence on the aperture ratio as much as possible and ensure that the electroluminescent display panel has the better display effect.

Figure 11:
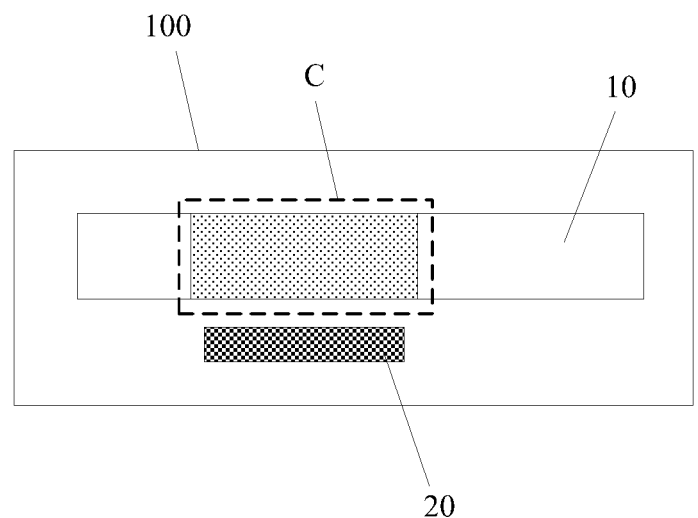
FIG. 11 is a schematic structural diagram of a display device in accordance with an embodiment of the disclosure.

Based upon the same inventive concept, an embodiment of the disclosure provides a display device, and as shown in FIG. 11 which is a schematic structural diagram of the display device 100, the display device 100 may include the electroluminescent display panel 10 described above and provided by the embodiments of the disclosure, and a photosensitive device 20;

the photosensitive device 20 is correspondingly arranged in the photosensitive device arranging region C.

In one embodiment of the disclosure, the photosensitive device 20 may be a camera or fingerprint recognition device or the like, which is not limited here and can be set according to the actual demand.

Figure 12:
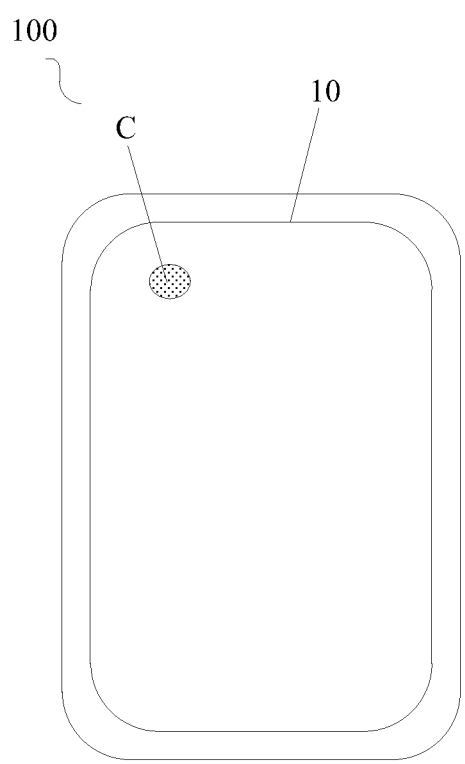
FIG. 12 is a schematic structural diagram of another display device in accordance with an embodiment of the disclosure.

In one embodiment, the display device may be a mobile phone (as shown in FIG. 12), a tablet, a television, a display, a laptop, a digital photo frame, a navigator, or any other product or device with display functions. The implementations of this display device can refer to the embodiments of the above-mentioned electroluminescent display panel, and the repeated description thereof will be omitted here.

What is claimed is:

1. An electroluminescent display panel, comprising: a display region, wherein the display region comprises a photosensitive device arranging region and a first normal display region which are arranged in a first direction;

the display region comprises a plurality of pixels, the plurality of pixels comprise first pixels located in the photosensitive device arranging region and second pixels located in the first normal display region, wherein a region between adjacent first pixels is a light-transmission region, and an arranging density of the first pixels is less than an arranging density of the second pixels;

the second pixels are arranged in an array, at least one first pixel is arranged in an extending direction of the first direction, in which the second pixels is located, in the photosensitive device arranging region; the electroluminescent display panel further comprises a plurality of signal lines extending in the first direction and arranged in a second direction, wherein each signal line is electrically connected to corresponding second pixels arranged in the first direction, and the first direction is perpendicular to the second direction;

at least one of two adjacent signal lines has an extending line, the extending line is located in the photosensitive device arranging region and overlaps with orthographic projections of the first pixels in a first specific pixel group and a second specific pixel group on a light-emitting surface of the electroluminescent display panel respectively, and the first pixels in the first specific pixel group and the second specific pixel group are electrically connected to one extending line;

wherein the first specific pixel group and the second specific pixel group comprise respective first pixels located in first straight lines of the second pixels correspondingly connected to two adjacent signal lines, the first specific pixel group and the second specific pixel group are adjacent in the second direction, and the first straight lines extend in the first direction.

2. The electroluminescent display panel of claim 1, wherein only one of two adjacent signal lines has an extending line;
   the first pixels in the first specific pixel group and the second specific pixel group are electrically connected to the extending line.

3. The electroluminescent display panel of claim 2, further comprising a non-display region surrounding the display region;
   the photosensitive device arranging region is arranged at a side of the display region close to the non-display region.

4. The electroluminescent display panel of claim 1, wherein the first pixels in the first specific pixel group and the first pixels in the second specific pixel group are misaligned in the first direction.

5. The electroluminescent display panel of claim 4, wherein the number of the first pixels in the first specific pixel group is the same as the number of the first pixels in the second specific pixel group.

6. The electroluminescent display panel of claim 5, wherein both of two adjacent signal lines have extending lines comprising a first extending line and a second extending line, wherein:
   the first extending line is electrically connected to the first pixels in the first specific pixel group, and overlaps with the first pixels in the second specific pixel group;
   the second extending line is electrically connected to the first pixels in the second specific pixel group, and overlaps with the first pixels in the first specific pixel group.

7. The electroluminescent display panel of claim 4, wherein the number of the first pixels in the first specific pixel group is greater than the number of the first pixels in the second specific pixel group.

8. The electroluminescent display panel of claim 7, wherein both of two adjacent signal lines have extending lines comprising a first extending line and a second extending line, wherein:
   the first extending line is electrically connected to a part of the first pixels in the first specific pixel group, the second extending line is electrically connected to the first pixels in the second specific pixel group and the other first pixels in the first specific pixel group, the number of the first pixels electrically connected to the first extending line is N1, and the number of the first pixels electrically connected to the second extending line is N2, wherein 0≤|N1−N2|≤1.

9. The electroluminescent display panel of claim 6, wherein the first extending line and the second extending line are arranged in different layers, and an orthographic projection of the first extending line on the light-emitting surface of the electroluminescent display panel overlaps with an orthographic projection of the second extending line on the light-emitting surface of the electroluminescent display panel.

10. The electroluminescent display panel of claim 8, wherein the first extending line and the second extending line are arranged in different layers, and an orthographic projection of the first extending line on the light-emitting surface of the electroluminescent display panel overlaps with an orthographic projection of the second extending line on the light-emitting surface of the electroluminescent display panel.

11. The electroluminescent display panel of claim 1, wherein orthographic projections of the first pixels on the light-emitting surface of the electroluminescent display panel are first projections, at least a part of the first projections comprise a first segment and a second segment connected, the first segment extends in a third direction, and the second segment extends in a fourth direction;
   an orthographic projection of the extending line on the light-emitting surface of the electroluminescent display panel is a second projection, the second projection comprises a second sub-projection overlapping with at least a part of the first projections, the second sub-projection comprises a third segment and a fourth segment connected, the third segment extends in the third direction, and the fourth segment extends in the fourth direction;
   wherein the third direction intersects with the fourth direction, and the third direction and the fourth direction both intersect with a row direction and a column direction.

12. The electroluminescent display panel of claim 11, wherein the first pixel comprises a pixel circuit and a light-emitting unit connected electrically, the light-emitting unit comprises an anode;
   a shape of an orthographic projection of the pixel circuit and the anode on the light-emitting surface of the electroluminescent display panel is same as a shape of the first projection.

13. The electroluminescent display panel of claim 1, wherein the signal lines are data lines, and the first direction is a column direction; or,
   the signal lines are gate lines, and the first direction is a row direction.

14. A display device comprising an electroluminescent display panel and a photosensitive device;
   wherein the electroluminescent display panel, comprises:
      a display region, wherein the display region comprises a photosensitive device arranging region and a first normal display region which are arranged in a first direction;
      the display region comprises a plurality of pixels, the plurality of pixels comprise first pixels located in the photosensitive device arranging region and second pixels located in the first normal display region, wherein a region between adjacent first pixels is a light-transmission region, and an arranging density of the first pixels is less than an arranging density of the second pixels;
      the second pixels are arranged in an array, at least one first pixel is arranged in an extending direction of the first direction, in which the second pixels is located, in the photosensitive device arranging region; the electroluminescent display panel further comprises a plurality of signal lines extending in the first direction and arranged in a second direction, wherein each signal line is electrically connected to corresponding second pixels arranged in the first direction, and the first direction is perpendicular to the second direction;
      at least one of two adjacent signal lines has an extending line, the extending line is located in the photosensitive device arranging region and overlaps with orthographic projections of the first pixels in a first specific pixel group and a second specific pixel group on a light-emitting surface of the electroluminescent display panel respectively, and the first pixels in the first specific pixel group and the second specific pixel group are electrically connected to one extending line;

wherein the first specific pixel group and the second specific pixel group comprise respective first pixels located in first straight lines of the second pixels correspondingly connected to two adjacent signal lines, the first specific pixel group and the second specific pixel group are adjacent in the second direction, and the first straight lines extend in the first direction; and wherein the photosensitive device is correspondingly arranged in the photosensitive device arranging region.

* * * * *